United States Patent
Ramazan et al.

(10) Patent No.: US 6,888,407 B2
(45) Date of Patent: May 3, 2005

(54) MULTISTAGE DIFFERENTIAL AMPLIFIER WITH CMFB CIRCUIT

(75) Inventors: Ercan Ramazan, Vallauris (FR); Richard Gaggl, Villach (AT); Frederic Pecourt, Mouans-Sartoux (FR); Christian Schranz, Villach (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/233,068

(22) Filed: Aug. 31, 2002

(65) Prior Publication Data

US 2003/0048134 A1 Mar. 13, 2003

(30) Foreign Application Priority Data

Aug. 31, 2001 (DE) .......................................... 101 42 707

(51) Int. Cl.$^7$ ................................................. H03F 3/45

(52) U.S. Cl. ....................................... 330/258; 327/563
(58) Field of Search .............. 330/9, 258; 327/560–563

(56) References Cited

U.S. PATENT DOCUMENTS

| 5,187,448 A | * | 2/1993 | Brooks et al. ............... 330/258 |
| 5,631,603 A | * | 5/1997 | Stubbe et al. .................. 330/9 |

* cited by examiner

Primary Examiner—Kenneth B. Wells

(57) ABSTRACT

The invention relates to a multistage differential amplifier having an input stage, at which a differential input voltage is present, a load connected to the input stage, a CMFB circuit and an output stage, at which an amplified differential output voltage is output. In order to improve the stability of a common-mode regulating loop, a current source is provided, which additionally feeds current into the regulating loop and thereby ensures that a control voltage for the load does not fall below a predetermined value.

12 Claims, 2 Drawing Sheets

MULTISTAGE DIFFERENTIAL AMPLIFIER WITH CMFB CIRCUIT

The invention relates to a multistage differential amplifier, in particular having an even number of stages with a CMFB circuit.

Operational amplifiers are essential components in many analog signal processing systems. In many applications, it is advantageous to use a fully differential operational amplifier (differential amplifier) whose output voltage, within a specific range, is not dependent on a common-mode voltage.

A fully differential differential amplifier generally requires a CMFB circuit (Common Mode Feedback Circuit) for setting the common-mode voltage, which usually lies in the middle between the positive and negative supply voltages (VDD+VSS)/2.

Figure 1:
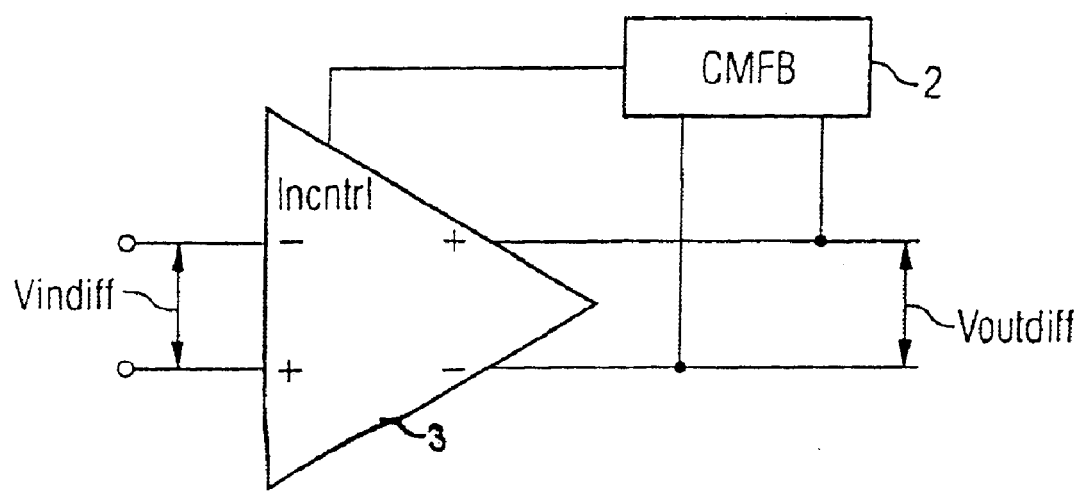

The basic construction of a differential amplifier with CMFB circuit is illustrated in FIG. 1. FIG. 1 shows an operational amplifier 3 having two inputs, at which a differential input voltage Vindiff is present, and two outputs, at which a differential amplified output voltage Voutdiff is output. The differential amplifier 3 furthermore comprises a CMFB circuit 2, which is connected in parallel with the output and serves for regulating the common-mode voltage to a mean value between the supply voltages. For this purpose, the operational amplifier 3 has an additional input Incntrl, to which the output voltages Uoutp, Uoutn are fed back via the CMFB circuit 2.

The gain of single-stage differential amplifiers is limited. Two- or multistage differential amplifiers are therefore used for higher gains.

A typical example of a two-stage differential amplifier is described in U.S. Pat. No. 5,955,922, wherein the CMFB circuit of the differential amplifier comprises an additional inverting element, as a result of which, in a feedback loop for setting the common-mode voltage, a total of three inversions take place between the feedback input and the outputs. The feedback is thus stable. With an even number of inversions, a positive feedback would be produced, as a result of which the system would be unstable. (In this connection, the term inversion is used when the increase in an input or control voltage leads to a reduction in the output quantity.) The differential amplifier illustrated in FIG. 3 of the U.S. patent specification has the disadvantage, however, that it is relatively unstable.

Therefore, the object of the present invention is to improve the stability properties of a multistage, in particular two-stage, differential amplifier.

The essential concept of the invention consists in providing an additional current source, which feeds current into the feedback loop of the differential amplifier and ensures that a sufficiently high voltage is present at control inputs of the active load and does not switch off or overdrive the latter. The controllable load thus never enters into the blocked or linear state and the differential amplifier remains functional.

In accordance with a preferred embodiment of the invention, an inverting element is arranged between the CMFB circuit and the load of the input stage. In this case, the additional current source is preferably connected in parallel with the inverting element. As a result, the current to be regulated decreases and, at the same time, a smaller loop gain is produced. This in turn results in a higher stability of the differential amplifier, which is reflected in a higher phase margin.

In accordance with a preferred embodiment of the invention, furthermore, an I/V converter is provided, which is connected to a control node of the load. This I/V converter is preferably a transistor connected as a diode.

The inverting element is preferably likewise a transistor, in particular a MOS transistor.

In accordance with a preferred embodiment of the invention, the load of the input stage is realized as a current mirror, in particular as a MOS current mirror.

The outputs of the input stage are preferably connected to control inputs (gates) of the output stage.

The CMFB circuit is preferably realized as an SC circuit (SC: Switched Capacitor).

Figure 2:
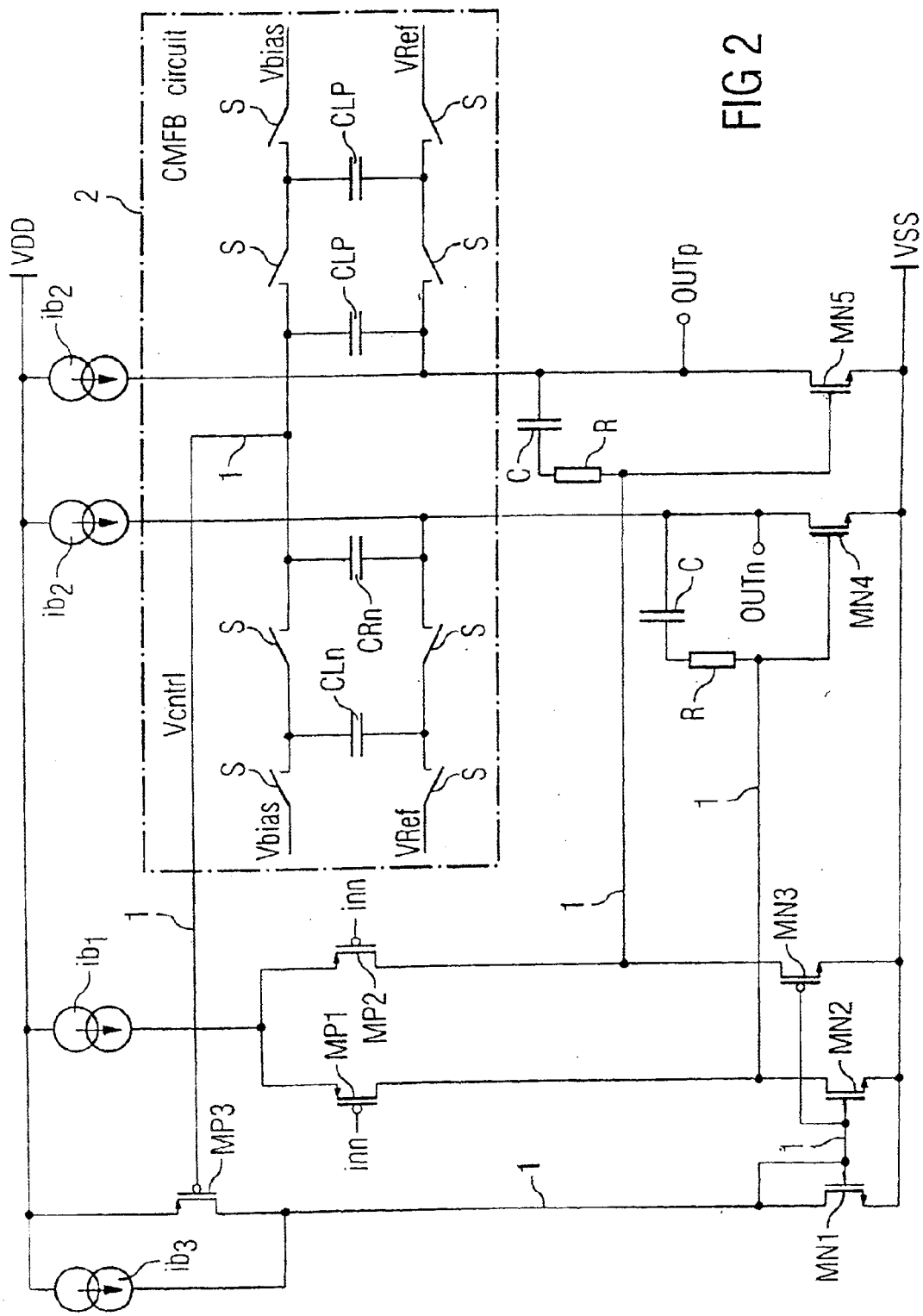

The invention is explained in more detail below by way of example with reference to the accompanying drawings, in which:

FIG. 1 shows a basic circuit diagram of a differential amplifier with CMFB circuit; and FIG. 2 shows a simplified circuit diagram of a differential amplifier in accordance with an exemplary embodiment of the invention.

With regard to FIG. 1, reference is made to the introduction to the description.

FIG. 2 shows the circuit diagram of a differential amplifier having an input stage MP1, MP2 and an output stage MN4 and MN5. The differential amplifier amplifies a differential signal present at the inputs inn, inp and outputs a differential, amplified output signal at the outputs OUTp, OUTn. The input stage comprises two PMOS transistors MP1, MP2, while the output stage is realized by means of two NMOS transistors MN4, MN5.

A load of the input stage is realized as a simple MOS current mirror comprising the transistors MN2, MN3.

The input stage is fed by a current source ib1 and the output stage is fed by identical current sources ib2, each of the MOS transistors MN4 and MN5 respectively being connected to one of the current sources ib2.

The differential amplifier furthermore comprises a feedback loop 1 with a conventional CMFB circuit 2. The CMFB circuit 2 comprises in each case two parallel-connected capacitors C1n, C2n and C1p, C2p for each of the transistors MN4 and MN5, respectively, of the output stage.

One connection of the capacitors C1n, C2n, C1p, C2p is in each case connected to a reference voltage Vref, which represents the desired value for a common-mode voltage Vcm. The other connection of the capacitors C1n, C2n, C1p, C2p is connected to a voltage $V_{bias}$. The capacitors C1n, C2n, C1p, C2p are charged or discharged via switches S.

The feedback loop 1 furthermore comprises an inverting element, a PMOS transistor MP3 in the present case. An increase in the gate voltage at the transistor MP3 brings about a reduction in the drain current, in other words a negative feedback or inversion takes place. The gate connection of the inverting element MP3 is connected to an output of the CMFB circuit 2 which outputs a control voltage Vcntrl.

An MNQS transistor MN1 connected as a diode is connected to the drain connection of the inverting element MP3. The gate connection of said transistor MN1 is connected to the gate connection of the current mirror MN2, MN3. The transistor MN1 connected as a diode essentially serves as an I/V converter for providing a control voltage for the current mirror MN2, MN3.

The drain connections of the transistors MN2, MN3 are in turn fed back to the gate connections of the transistors MN4 and MN5, respectively, of the output stage.

The arrangement just described is already functional, but may have stability problems at high control voltages Vcntrl of the inverting element MP3. As mentioned, the drain current of the transistor MP3 decreases at high control voltages Vcntrl. In the case of excessively small currents, therefore, it can happen that the transistor MN1 obtains high impedance and the transistors MN2, MN3 of the load switch off.

In order to avoid this, a current source ib3 is provided, which is connected in parallel with the inverting element MP3, namely to the supply voltage Vdd and an output of the inverting element MP3. The current source ib3 additionally feeds current into the feedback loop 1 and thus ensures sufficient current in order to hold the transistor MN1 and the load MN2, MN3 in the switched-on state. The current supplied by the current source ib3 ensures, in particular, a voltage at the transistor MN1 which is greater than a threshold voltage of the transistor MN1.

If the control voltage Vcntrl tends toward VSS, the control voltage of the load MN2, MN3 does not tend toward the supply voltage VDD owing to the current source ib3. Consequently, the input stage MP1, MP2 is never switched off. Since the gain factor of the regulating circuit is reduced, the correction is effected at lower speed, so that overall a greater stability is achieved.

| List of reference symbols | |
|---|---|
| 1 | Feedback loop |
| 2 | CMFB circuit |
| 3 | Operational amplifier |
| Vindiff | Differential input voltage |
| Voutdiff | Differential output voltage |
| Incntrl | Auxiliary input |
| ib1, ib2, ib3 | Current sources |
| MP1, MP2 | Input stage |
| MP3 | Inverting element |
| MN1 | Transistor |
| MN2, MN3 | Load |
| MN4, MN5 | Output stage |
| C1n, C2n | Capacitors |
| C1p, C2p | Capacitors |
| S | Switch |
| Vref | Reference voltage |
| $V_{bias}$ | Auxiliary voltage |
| Vcntrl | Control voltage |
| Vdd, Vss | Supply voltage |

What is claimed is:

1. A multistage differential amplifier comprising
an input stage
a load connected to the input stage,
a CMFB circuit;
an output stages;
a feedback loop tar setting a common-mode voltage wherein a current source is provided, which additionally feeds current into the feedback loop to prevent the load from being switched off; and
a multistage differential amplifier wherein the number of stages of the differential amplifier is even.

2. A multistage differential amplifier according to claim 1, wherein an inverting element is provided in the feedback loop.

3. A multistage differential amplifier according to claim 2, wherein the inverting element is connected to the CMFB circuit.

4. A multistage differential amplifier according to claim 1, wherein an I/V converter is connected downstream of the inverting element.

5. A multistage differential amplifier according to claim 4, the I/V converter is a transistor connected as a diode.

6. A multistage differential amplifier according to claim 2, wherein inverting element is a PMOS transistor.

7. A multistage differential amplifier according to claim 1, wherein the load is a current mirror.

8. A multistage differential amplifier according to claim 4, wherein the I/V converter is connected to the load.

9. A multistage differential amplifier according to claim 1, wherein the CMFB circuit is formed as an integrated circuit.

10. A multistage differential amplifier according to claim 1, wherein an output of the input stage is connected to a control input of the output stage.

11. A multistage differential amplifier according to claim 1, wherein the number of stages of the differential amplifier is two.

12. A multistage differential amplifier comprising
an input stage
a load connected to the input stage,
a CMFB circuit;
an output stage;
a feedback loop for setting a common-mode voltage wherein a current source is provided, which additionally feeds current into the feedback loop to prevent the load from being switched off; and
a multistage differential amplifier wherein an inverting element is provided in the feedback loop,
wherein the current source is arranged in parallel with the inverting element.

* * * * *